United States Patent
Kim

(10) Patent No.: US 7,033,434 B2
(45) Date of Patent: Apr. 25, 2006

(54) MASK FOR CRYSTALLIZING, METHOD OF CRYSTALLIZING AMORPHOUS SILICON AND METHOD OF MANUFACTURING ARRAY SUBSTRATE USING THE SAME

(75) Inventor: Young-Joo Kim, Dae-gu (KR)

(73) Assignee: LG. Philips LCD Co., Ltd., Seoul (KR)

(*) Notice: Subject to any disclaimer, the term of this patent is extended or adjusted under 35 U.S.C. 154(b) by 84 days.

(21) Appl. No.: 10/745,595

(22) Filed: Dec. 29, 2003

(65) Prior Publication Data
US 2004/0134417 A1 Jul. 15, 2004

(30) Foreign Application Priority Data
Dec. 30, 2002 (KR) ............... 10-2002-0086988

(51) Int. Cl.
*C30B 25/12* (2006.01)
(52) U.S. Cl. ................ 117/4; 117/89; 117/90; 117/92; 117/95; 117/97
(58) Field of Classification Search .......... 117/4, 117/89, 90, 92, 95, 97
See application file for complete search history.

(56) References Cited
U.S. PATENT DOCUMENTS
6,322,625 B1  11/2001  Im
6,338,987 B1   1/2002  Yi et al.
6,368,945 B1   4/2002  Im FOREIGN PATENT DOCUMENTS
JP   2002-324759      11/2002
KR   20010029934 A     4/2001

OTHER PUBLICATIONS

R. S. Sposili, et al. "Single Crystal Si Films Via a Low-Substrate-Temperature Excimer-Laser Crystallization Method", Mat. Res. Soc. Symp. Proc. vol. 452, ©1997 Materials Research Society, pp. 953-958.

*Primary Examiner*—Felisa Hiteshew
(74) *Attorney, Agent, or Firm*—Birch, Stewart, Kolasch & Birch, LLP

(57) ABSTRACT

A method of crystallizing amorphous silicon is used for manufacturing an array substrate having thin film transistors, pixel electrodes and an alignment key. The method includes forming an amorphous silicon layer over a substrate, forming an alignment key in the amorphous silicon layer, preparing a mask including pattern portions and an alignment key pattern, disposing the mask over the substrate having the amorphous silicon layer, wherein the alignment key pattern is aligned with the alignment key, and applying a first shot of a laser beam to in the amorphous silicon layer to form first polycrystalline silicon areas corresponding to the pattern portions of the mask.

17 Claims, 8 Drawing Sheets

Ion doping

Laser activation

MASK FOR CRYSTALLIZING, METHOD OF CRYSTALLIZING AMORPHOUS SILICON AND METHOD OF MANUFACTURING ARRAY SUBSTRATE USING THE SAME

This application claims the benefit of Korean Patent Application No. 2002-86988, filed in Korea on Dec. 30, 2002, which is hereby incorporated by reference.

BACKGROUND OF THE INVENTION

1. Field of the Invention

The invention relates to a method of crystallizing amorphous silicon. More particularly, the invention relates to a mask for crystallizing the amorphous silicon, a sequential lateral solidification (SLS) crystallizing method and a manufacturing method of an array substrate using the same.

2. Discussion of the Related Art

Due to rapid development in information technology, display devices have evolved into instruments that can process and display a great deal of information. Flat panel display devices, which have properties of thinness, low weight and low power consumption, such as liquid crystal display (LCD) devices, have been developed. The LCD device is widely used for notebook computers, desktop monitors, etc. because of its superior resolution, color image display and quality of displayed images.

In general, the liquid crystal display (LCD) device includes two substrates, which are spaced apart and facing each other, and a liquid crystal layer interposed between the two substrates. Each of the substrates includes an electrode, and the electrodes of each substrate are also facing each other. Voltage is applied to each electrode and an electric field is induced between the electrodes. The alignment of the liquid crystal molecules is changed by varying the intensity or direction of the electric field. The LCD device displays a picture by varying the transmittance of the light varying according to the arrangement of the liquid crystal molecules.

One substrate of the LCD device includes a thin film transistor that acts as a switching device. Amorphous silicon is widely used as an active layer of the thin film transistor because amorphous silicon can be formed on a large, low cost substrate such as glass.

The LCD device also includes a drive integrated circuit (drive IC) that controls the thin film transistor. Unfortunately, amorphous silicon does not form a suitable active layer for the drive IC, which usually includes CMOS (complementary metal-oxide-semiconductor) devices that require crystalline silicon as active layers. Because of this, the drive IC is usually connected to the array substrate using a TAB (tape automated bonding) system. This adds significant cost to the LCD device.

Because of the limitations of amorphous silicon, an LCD device that incorporates polycrystalline silicon as an active layer is being researched and developed. Polycrystalline silicon is highly beneficial because it is much better suited for use in the drive IC than amorphous silicon. Polycrystalline silicon thus has the advantage that the number of fabrication steps could be reduced because a thin film transistor and a drive IC could be formed on the same substrate, eliminating the need for TAB bonding. Furthermore, the field effect mobility of polycrystalline silicon is 100 to 200 times greater than that of amorphous silicon. Polycrystalline silicon is also optically and thermally stable.

Polycrystalline silicon can be formed by depositing amorphous silicon on a substrate, such as by plasma enhanced chemical vapor deposition (PECVD) or low-pressure chemical vapor deposition (LPCVD), and then crystallizing that amorphous silicon into polycrystalline silicon. There are a number of different methods of crystallizing amorphous silicon into polycrystalline silicon, including solid polycrystalline crystallization (SPC), metal induced crystallization (MIC), and laser annealing.

In SPC, a buffer layer is formed on a quartz substrate. Then, amorphous silicon is deposited on the buffer layer. The amorphous silicon is then heated at a high temperature, over 600 degrees Celsius, for a relatively long time. The buffer layer prevents impurities from diffusing into the amorphous silicon. The high temperature causes the amorphous silicon to crystallize. However, the SPC method results in irregular grain growth and non-uniform grain size. Therefore, gate insulating layers grow irregularly on SPC-formed polycrystalline silicon. This decreases the breakdown voltage of the resulting TFTs. Moreover, the electric properties of the TFTs are reduced because of the irregular grain sizes. Additionally, quartz substrates are expensive.

In MIC, a metal deposited on amorphous silicon induces crystallization at a relatively low temperature. This has the advantage that lower cost glass substrates can be used. However, the deposited metals remaining in the silicon layer act as detrimental impurities.

In laser annealing, an excimer laser irradiates an amorphous silicon layer on a substrate for several tens to several hundreds of nanoseconds. This causes the amorphous silicon layer to melt. The melted silicon subsequently solidifies into polycrystalline silicon. In the laser annealing method, crystallization can be accomplished at less than 400 degrees Celsius. Unfortunately, crystallization is relatively poor, particularly if the silicon layer is crystallized using a single laser shot. In practice, re-crystallization is usually performed by irradiating the laser beam about 10 times or so to increase the grain size. Therefore, laser annealing suffers from low productivity. Furthermore, laser irradiation can heat the silicon layer to about 1400 degrees Celsius. Because such temperatures would readily oxidize the silicon layer to produce silicon dioxide ($SiO_2$), laser annealing is usually performed at room temperatures and in air or atmosphere.

Recently, a new method of crystallization, often referred to as sequential lateral solidification (SLS), has become of interest. The SLS method takes advantage of the fact that silicon grains grow laterally from the boundary between liquid silicon and solid phase silicon. The SLS method can increase the size of the silicon grains that grow by controlling the energy intensity of a laser beam and the irradiation range of the laser beam (see Robert S. Sposilli, M. A. Crowder, and James S. Im, *Mat. Res. Soc. Symp. Proc.*, Vol. 452, 956–957, 1997). This enables TFTs having channel areas of single crystalline silicon.

A related art SLS method will be described in detail with reference to the attached drawings. FIG. 1A shows a mask for a sequential lateral solidification (SLS) method according to the related art and FIG. 1B illustrates a silicon layer crystallized by using the mask of FIG. 1A.

As shown in FIG. 1A, a mask 10 for a SLS method includes a slit 12 of several micrometers, and thus makes a laser beam incident on an amorphous silicon layer have a width of several micrometers. Here, a space between adjacent slits 12 also is several micrometers, and the slits may have a width within a range of about 2 μm to 3 μm.

If a laser beam is irradiated on an amorphous silicon layer 20 of FIG. 1B through the slit 12 of the mask 10, a region 22 exposed to the laser beam is completely melted, and then is solidified to form grains 24a and 24b. At this time, the grains 24a and 24b grow laterally from both end lines of the region 22, and stop growing at the line 26 where the grains 24a and 24b meet each other. The line 26 may be referred to as a grain boundary. Here, the mask 10 includes a plurality of slits 10, and a crystallized region corresponding to a size of the mask 10 may be referred to as a unit region.

Next, a laser beam is irradiated on a next region including the region 22 of FIG. 1B, and then the next region is crystallized. The amorphous silicon layer 20 may be wholly crystallized by repeatedly performing the above-mentioned processes.

FIG. 2 shows a part of a silicon layer crystallized by the above method. In FIG. 2, the crystallized silicon layer includes multiple unit regions 30, and there are first and second overlap regions 40 and 50 between adjacent unit regions 30. The first overlap region 40 is disposed between the adjacent unit regions 30 in a horizontal direction (in the context of FIG. 2) and the second overlap region 50 is formed between the adjacent unit regions 30 in a vertical direction (in the context of FIG. 2). The first and second overlap regions 40 and 50, where the laser beam is irradiated several times, include non-uniform parts. Therefore, in the case where the first and second overlap regions 40 and 50 are disposed in a pixel area of a liquid crystal display device, the quality of displayed images decreases.

SUMMARY OF THE INVENTION

Accordingly, the invention is directed to a mask for crystallizing, a method of crystallizing amorphous silicon and a method of manufacturing an array substrate using the same that substantially obviates one or more of these problems due to limitations and disadvantages of the related art.

An object of the invention is to provide polycrystalline silicon having large and more uniform-sized grains.

Another object of the invention is to provide a method of crystallizing amorphous silicon that has shorter processing time.

Another object of the invention is to provide a method of manufacturing an array substrate including polycrystalline silicon that has shorter processing time.

To achieve these and other objects and advantages, the invention, in part, pertains to a method of crystallizing amorphous silicon, wherein the method is used for manufacturing an array substrate having thin film transistors, pixel electrodes and an alignment key, includes forming an amorphous silicon layer over a substrate, forming an alignment key in the amorphous silicon layer, preparing a mask including pattern portions and an alignment key pattern, the pattern portions corresponding to the thin film transistors, disposing the mask over the substrate having the amorphous silicon layer, wherein the alignment key pattern is aligned with the alignment key, and applying a first shot of a laser beam to in the amorphous silicon layer through the mask, thereby forming first polycrystalline silicon areas corresponding to the pattern portions of the mask.

The invention, in part, pertains to a mask for crystallizing amorphous silicon, wherein the mask is used for manufacturing an array substrate including thin film transistors, pixel electrodes and an alignment key, that includes multiple an alignment key pattern corresponding to the alignment key and multiple pattern portions corresponding to the thin film transistors.

The invention, in part, pertains to a method of manufacturing an array substrate having thin film transistors, pixel electrodes and an alignment key, that includes forming an amorphous silicon layer on a substrate, crystallizing the amorphous silicon layer to form polycrystalline silicon areas including forming an alignment key in the amorphous silicon layer, preparing a mask including pattern portions and an alignment key pattern, the pattern portions corresponding to the thin film transistors, disposing the mask over the substrate having the amorphous silicon layer, wherein the alignment key pattern is aligned with the alignment key, and applying a first shot of a laser beam to the amorphous silicon layer through the mask, wherein the polycrystalline silicon areas correspond to the pattern portions of the mask. The invention includes forming active layers by patterning the polycrystalline silicon areas, sequentially forming gate insulating layers and gate electrodes on the active layers, doping impurities into both sides of the active layers by using the gate electrodes as masks, thereby forming source and drain regions, forming an interlayer on the substrate including the gate electrodes, the interlayer having first and second contact holes exposing the source and drain regions, respectively, forming source and drain electrodes on the interlayer, the source and drain electrodes connected to the source and drain regions through the first and second contact holes, respectively, forming a passivation layer on the source and drain electrodes, the passivation layer having third contact holes exposing the drain electrodes, and forming pixel electrodes on the passivation layer, the pixel electrodes being connected to the drain electrodes through the third contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Reference will now be made in detail to embodiments of the invention, which is illustrated in the accompanying drawings.

Figure 1A:
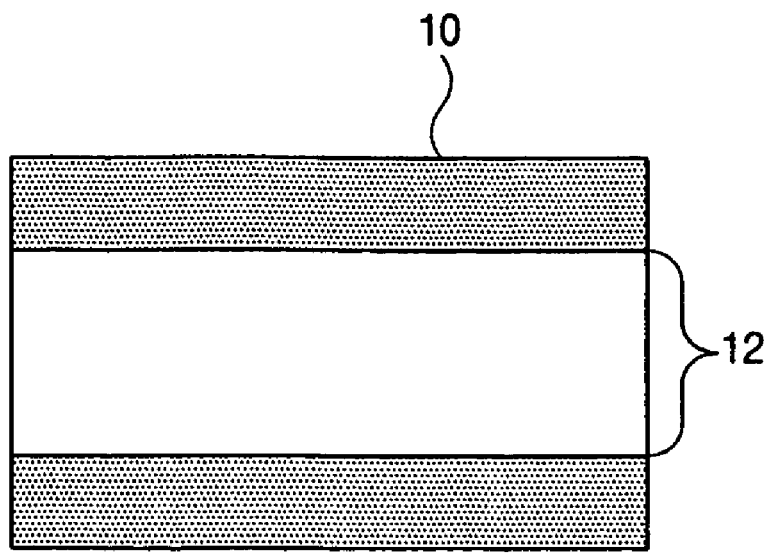
FIG. 1A is a schematic view of showing a mask for a sequential lateral solidification (SLS) method according to the related art.
Figure 1B:
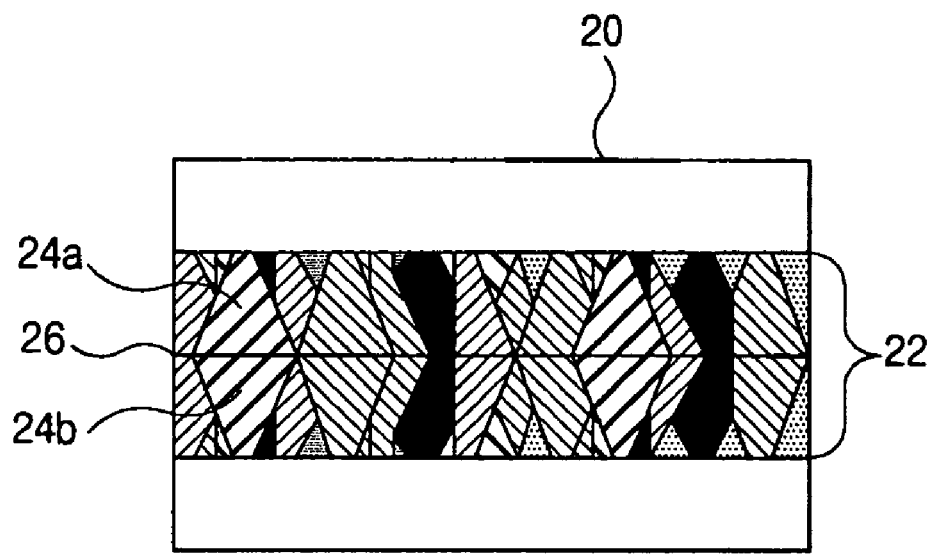
FIG. 1B is a schematic view of illustrating a silicon layer crystallized by using the mask of FIG. 1A.
Figure 2:
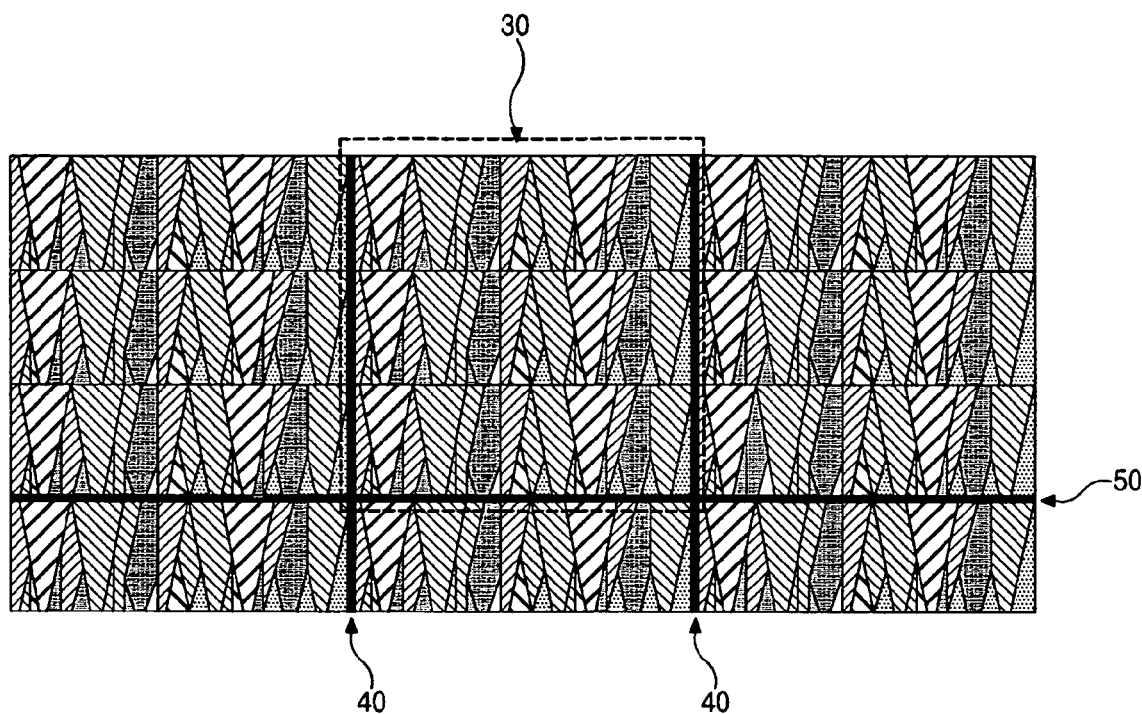
FIG. 2 is a schematic view of showing a part of a silicon layer crystallized by the SLS method.
Figure 3:
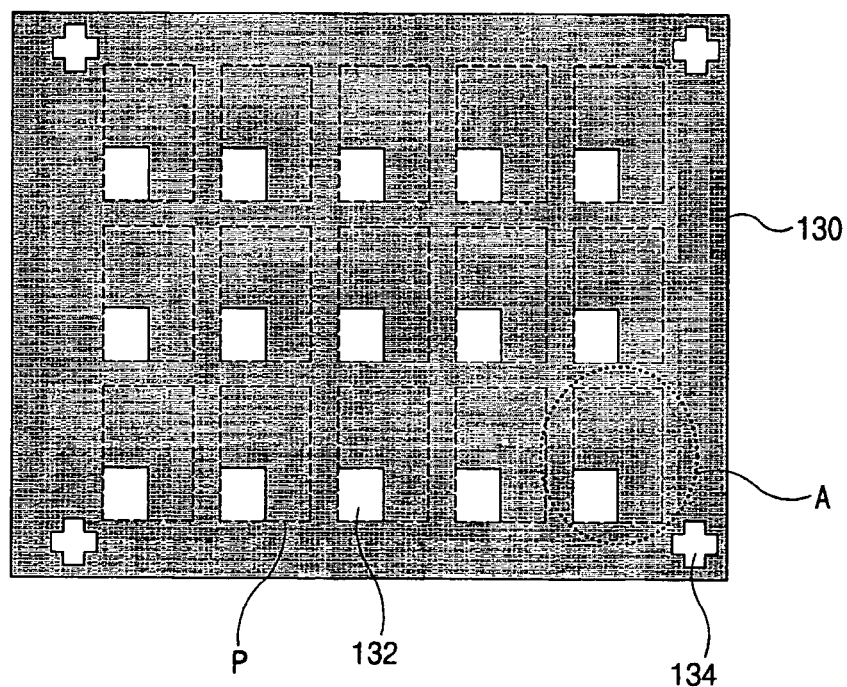
FIG. 3 is a schematic plan view showing a mask for crystallizing the amorphous silicon layer according to an embodiment of the invention.

FIG. 3 is a schematic plan view showing a mask for crystallizing the amorphous silicon layer according to an embodiment of the invention. As shown in FIG. 3, the mask 130 includes alignment key patterns 134 and multiple (one or more) pattern parts 132. Each of the alignment key patterns 134 is disposed at each corner of the mask 130. Each of pattern parts 132 corresponds to a region where a thin film transistor to be formed by using a crystallized silicon layer will be disposed. Thus, when an amorphous silicon layer is crystallized by using the mask 130 of FIG. 3, only a region corresponding to the thin film transistor is crystallized. Here, the region P indicted by the dotted line corresponds to a pixel area of the array substrate. At this time, the pattern part 132 is designed to have a larger size than the thin film transistor, considering alignment margins, and the pattern part 132 is not disposed in the light transmitting portion of the pixel area P where light is emitted.

Figure 4:
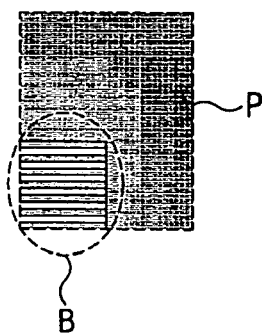
FIG. 4 is an enlarged view of the region A of FIG. 3.

FIG. 4 is an enlarged view of the region A of FIG. 3. As shown in FIG. 4, the mask 130 of FIG. 3 includes the pixel area P of blocking layer and the pattern portion B having multiple slits.

Figure 5A:
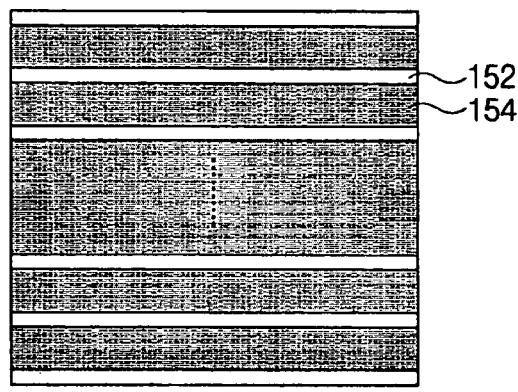
FIGS. 5A and 5B are schematic views of showing slit structures of the mask according to the invention
Figure 5B:
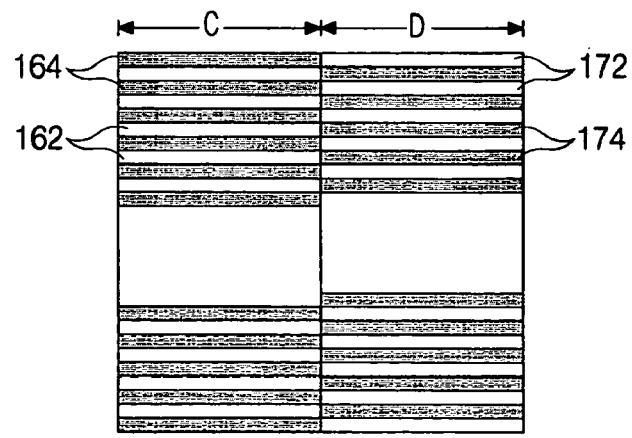

FIGS. 5A and 5B shows the slit structures of the mask according to the invention.

In FIG. 5A, the pattern portion, which corresponds to the thin film transistor, includes multiple slits 152 separated by fixed spaces 154. The slits 152 make laser beams incident on an amorphous silicon layer to have a width of several micrometers. Here, each slit 152 has a width within a range of about 2 μm to about 3 μm and each space 154 has a width over 4 μm, and more particularly within a range of about 4 μm to 6 μm.

In FIG. 5B, the pattern portion B of FIG. 4 has a first region C and a second region D. The first region C includes a plurality of first slits 162 separated by first spaces 164 of regular intervals and the second region D includes a plurality of second slits 172 separated by second spaces 174 of regular intervals. The first slits 162 correspond to the second spaces 174 and the first spaces 164 correspond to the second slits 172. The first and second slits 162 and 172 may have a width within a range of about 2 μm to about 3 μm.

Preferably, the sizes of the slits, the spaces and the alignment key patterns may be designed considering the shrinking rate of a projection lens used for crystallizing the amorphous layer.

Figure 6A:
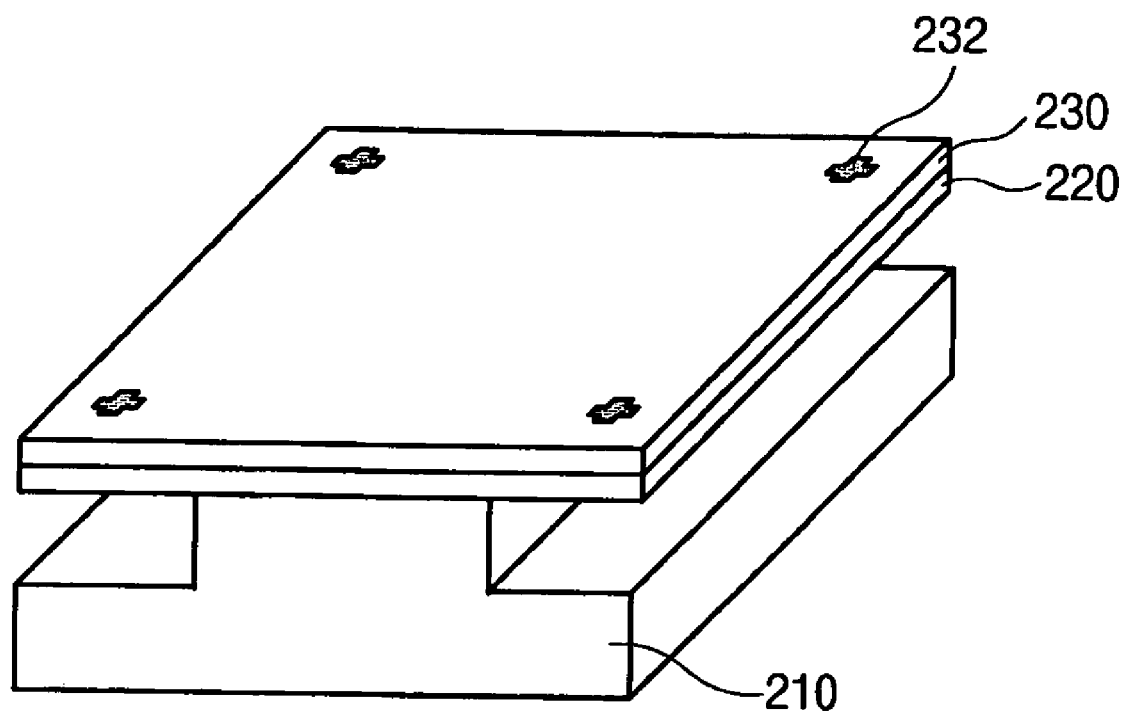
FIGS. 6A to 6C are schematic views of illustrating a process of crystallizing an amorphous silicon layer using the mask of the invention.
Figure 6B:
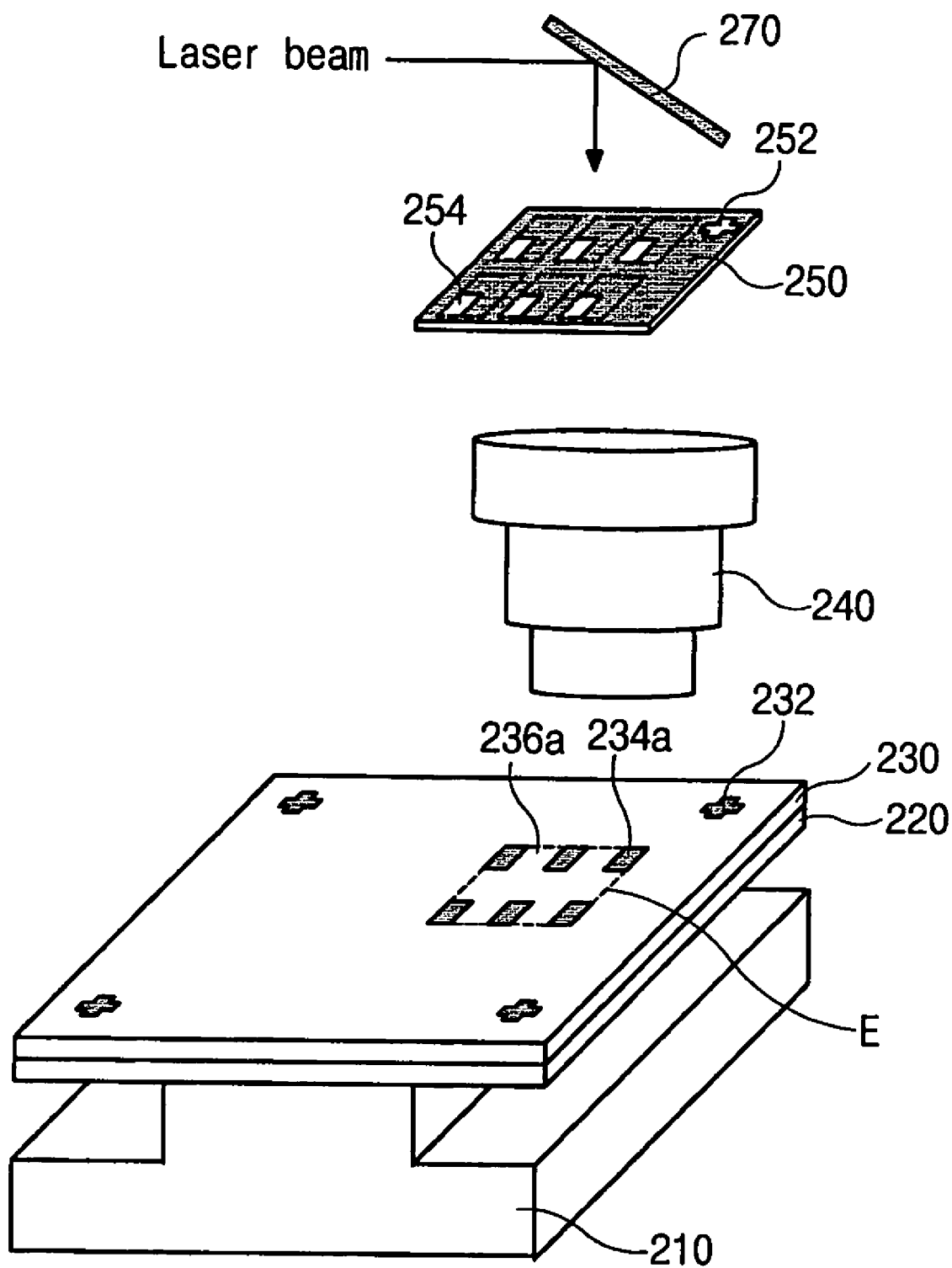
Figure 6C:
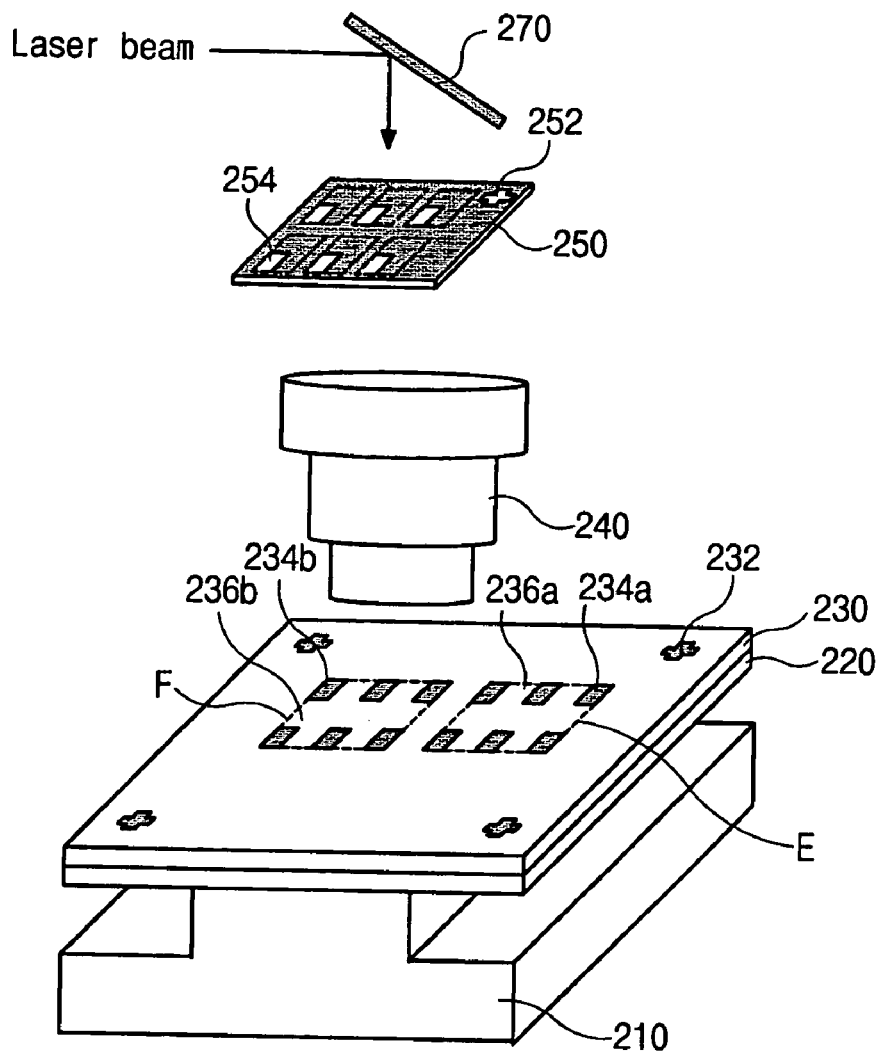

FIGS. 6A to 6C illustrate a process of crystallizing an amorphous silicon layer using the mask of the present invention.

As shown in FIG. 6A, a substrate 220 including an amorphous silicon layer 230 thereon is disposed on a stage 210. Alignment keys 232 are formed in the amorphous silicon layer 230. The alignment keys 232 can be formed at the corners of the substrate or around the corners of the substrate. Although four alignment keys 232 are formed in this embodiment, the number of the alignment keys 232 is not limited. Thus, one alignment key can be formed. The alignment keys 232 may be formed by a light source such as a laser beam, which may be used for crystallization. In this case, the energy density of a laser beam for the alignment keys 232 may be around nearly completely melting region. The alignment keys may be formed through a photolithographic process. The alignment keys 232 may have various shapes.

Next, as shown in FIG. 6B, a projection lens 240 is arranged spaced apart from and over the substrate 220. A mask 250, which includes multiple pattern portions 254 and an alignment key pattern 252, is disposed over the projection lens 240. Here, only a part of the mask 250 is illustrated. The alignment key pattern 252 is aligned with the alignment key 232, whereby the mask 250 is aligned with the substrate 230. Next, a laser beam is reflected from a mirror 270 and irradiated on the amorphous silicon layer 230. Thus, the amorphous silicon layer 230 corresponding to a first shot of the laser beam is crystallized by the sequential lateral solidification (SLS) crystallizing method, and first polycrystalline silicon areas are formed in the amorphous silicon layer 230 corresponding to areas where thin film transistors will be formed later, respectively. A first portion E corresponding to the first shot includes a first region 234a, which has the first polycrystalline silicon areas, and a second region 236a, which is amorphous silicon.

As shown in FIG. 6C, the stage 210 moves. On the other hand, the mask 250 may be moved. Then, a laser beam is reflected from the mirror 270 and irradiated on the amorphous silicon layer 230 again. Thus, the amorphous silicon layer 230 corresponding to a second shot of the laser beam is crystallized by the SLS crystallizing method, and second polycrystalline silicon areas are formed in the amorphous silicon layer 230 corresponding to areas where thin film transistors will be formed later, respectively. A second portion F corresponding to the second shot includes a first region 234b, which has the second polycrystalline silicon areas, and a second region 236b, which is amorphous silicon. The first portion E and the second portion F are not overlapped.

Since the pattern portions 254 of the mask 250 may have the structure of FIG. 5A or FIG. 5B, all the first regions 234a and 234b of the first portion E and the second portion F may not be crystallized. That is, only parts corresponding to slits of the pattern portions 254 of the mask 250 may be crystallized. Therefore, after first shot to nth (n is integer) shot of a laser beam may be completed horizontally in the context of the figure, the mask 250 or the stage 210 may move vertically in the context of the figure. Then, first shot to nth shot of a laser beam may be repeatedly performed along a horizontal direction in the context of the figure.

Polycrystalline silicon areas are formed all over the surface of the substrate by repeatedly performing the above-mentioned processes.

In the invention, since the amorphous silicon layer is crystallized by using the mask that has the pattern portions corresponding to the thin film transistors and the alignment key patterns, processing time is reduced and non-uniform crystalline regions are not formed.

Meanwhile, an array substrate for a liquid crystal display device can be manufactured by forming an active layer using the polycrystalline silicon according to the invention, and subsequently forming a gate insulating layer, a gate electrode, source and drain electrodes, and a pixel electrode on the active layer.

FIGS. 7A to 7F shows a manufacturing method of an array substrate for a liquid crystal display device according to the invention.

Figure 7A:
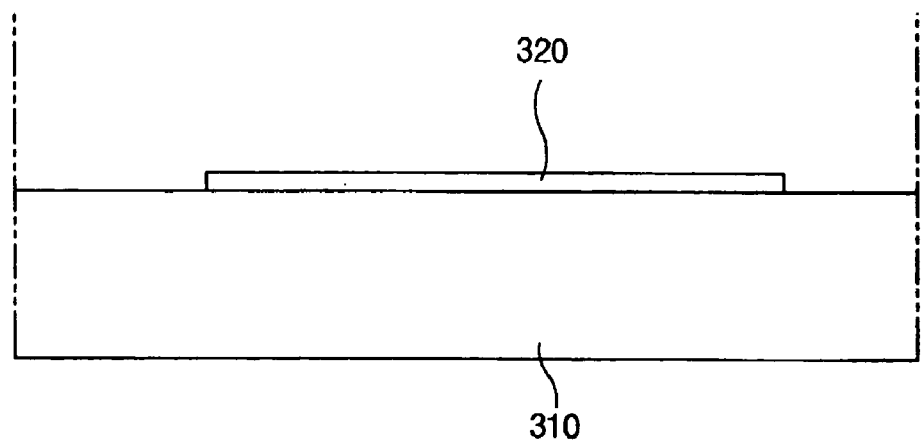
FIGS. 7A to 7F are schematic cross-sectional views of showing a manufacturing method of an array substrate for a liquid crystal display device according to the invention.

In FIG. 7A, polycrystalline silicon is formed in an area where a thin film transistor will be formed by the above-mentioned method, thereby forming an island shaped polycrystalline silicon layer 320 on a substrate 310.

Figure 7B:
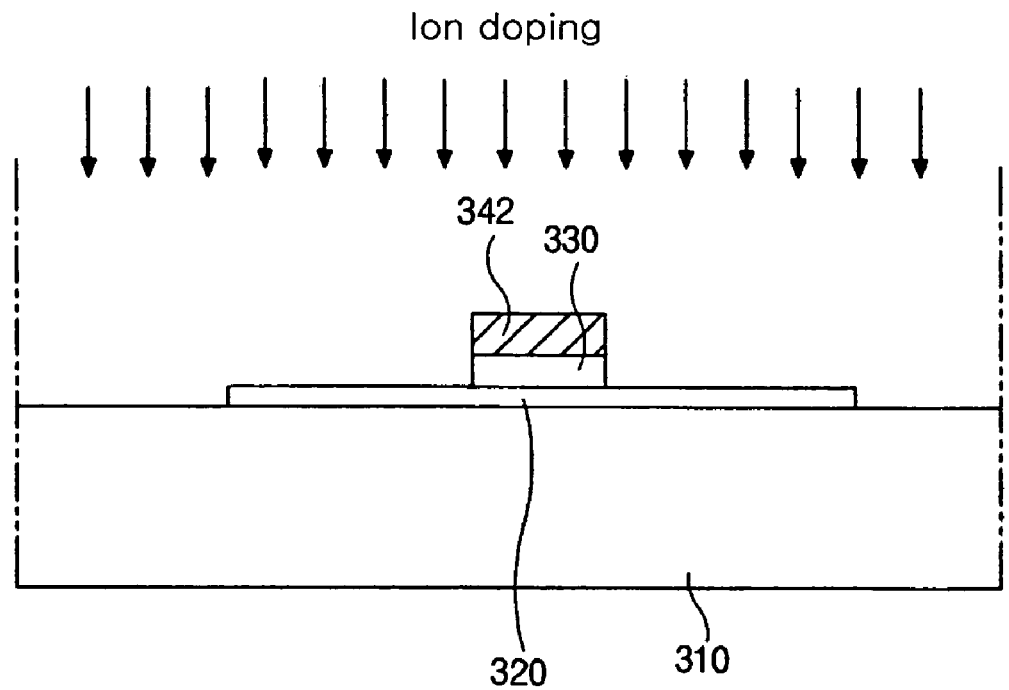

Next, in FIG. 7B, an insulating material of silicon nitride or silicon oxide and a conductive material of metal are sequentially deposited on the polycrystalline silicon layer 320 and then patterned, thereby sequentially forming a gate insulating layer 330 and a gate electrode 342 on the polycrystalline semiconductor layer 320. Thereafter, impurities such as p-type or n-type ions are doped on the exposed portions of the polycrystalline semiconductor layers 320.

Figure 7C:
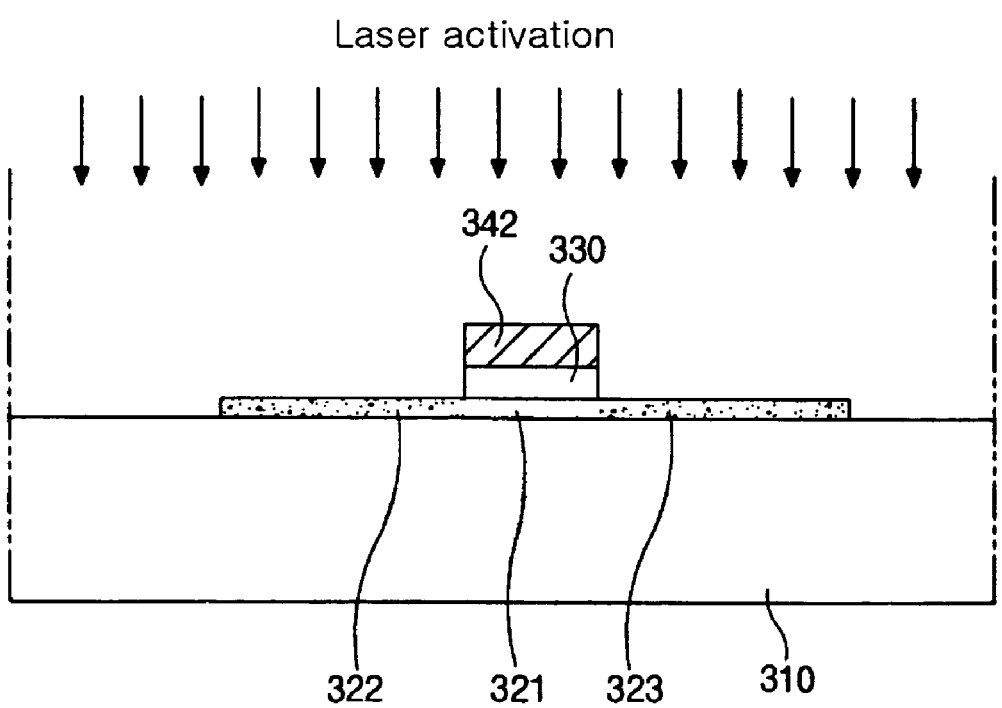

In FIG. 7C, after doping, the polycrystalline semiconductor layer 320 is divided into a channel region 321, where the impurities are not doped, and source and drain regions 322 and 323 where the impurities are doped. The source and drain regions 322 and 323 are located on both sides of the channel region 321. Here, a process for activating the ions doped in the source and drain regions 322 and 323 is required, and an annealing process is commonly used.

Meanwhile, a process for restoring the source and drain regions 322 and 323 to the polycrystalline state is also needed, because the semiconductor structures in the source and drain regions 322 and 323 may change from the polycrystalline state into the amorphous state due to the ion doping energy. By the way, if the conventional annealing process may be used to restore the source and drain regions 322 and 323 to the polycrystalline state, the annealing process should be performed under high temperatures for a long time, and thus the substrate may be transformed. To solve the problem, a laser annealing process is performed.

Not only the doped ions may be activated, but also the source and drain regions 322 and 323, being amorphous, may be restored to the crystalline state through the laser process.

Figure 7D:
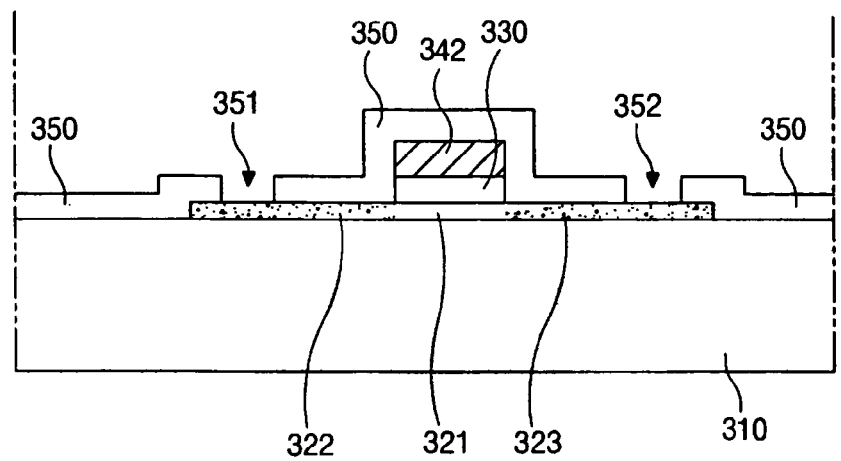

In FIG. 7D, an interlayer 350 is formed on the entire surface of the substrate 310 including the gate electrode 342 and is patterned, thereby forming first and second contact holes 351 and 352 exposing the source and drain electrodes 322 and 323, respectively. The interlayer 350 may include at least one or both of silicon oxide or silicon nitride. The interlayer can also be silicon oxynitride.

Figure 7E:
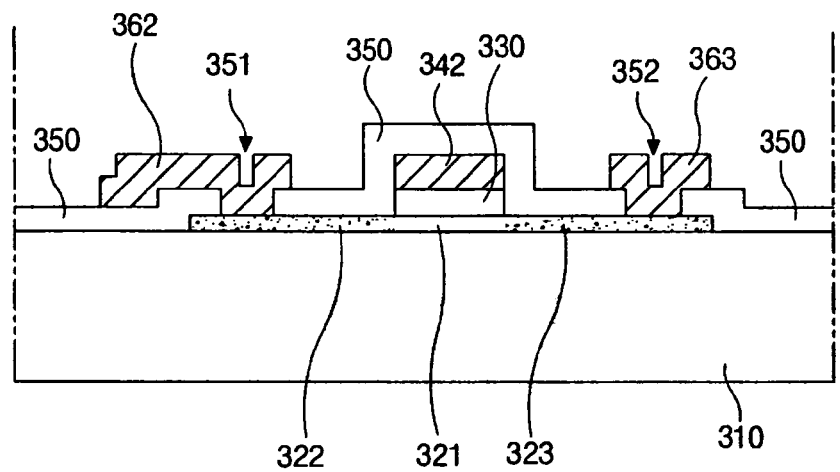

In FIG. 7E, a metal layer is deposited on the interlayer 350 and then is patterned, thereby forming a source electrode 362 and a drain electrode 363. The source electrode 362 is connected to the source region 322 through the first contact hole 351 and the drain electrode 363 is connected to the drain region 323 through the second contact hole 352. The source and drain electrodes 362 and 363 constitute a thin film transistor with the gate electrode 342.

Figure 7F:
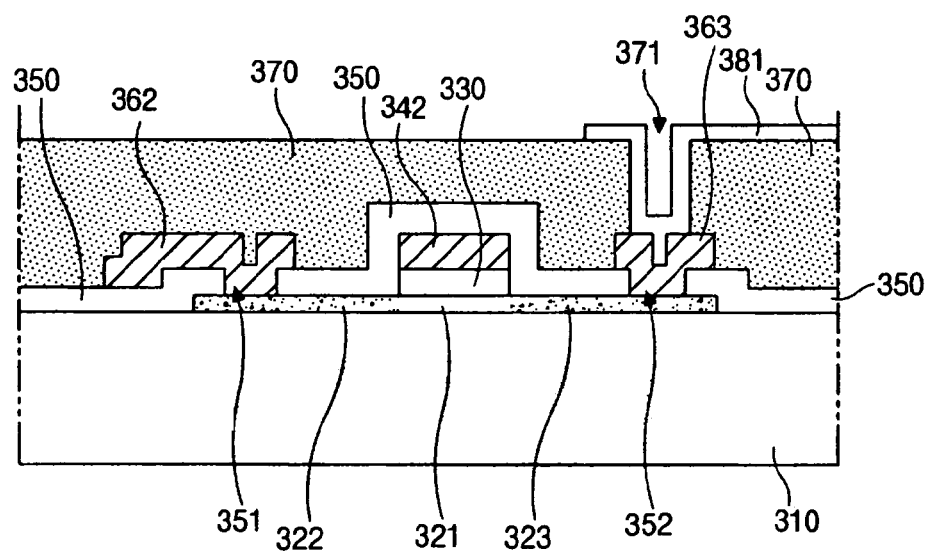

Next, in FIG. 7F, a passivation layer 370 is formed on the entire surface of the substrate 310 including source and drain electrodes 362 and 363 and then patterned, thereby forming a third contact hole 371 exposing the drain electrode 363. A pixel electrode 381 is formed on the passivation layer 370 with a transparent conductive material. The pixel electrode 381 is connected to the drain electrode 363 through the third contact hole 371.

Since the thin film transistor including the polycrystalline silicon layer has high field effect mobility, the response speed is fast. In addition, manufacturing processes and costs of the liquid crystal display device can be reduced because the thin film transistor and a drive IC including CMOS elements could be formed on the same substrate.

Meanwhile, since only the portion corresponding to the thin film transistor is crystallized, processing time is reduced, and non-uniform crystalline regions are not formed.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A mask for crystallizing an amorphous silicon, wherein the mask is used for manufacturing an array substrate including thin film transistors, pixel electrodes and an alignment key, the mask comprising:

an alignment key pattern corresponding to the alignment key; and a plurality of pattern portions corresponding to the thin film transistors.

2. The mask according to claim 1, wherein each pattern portion includes a plurality of slits.

3. The mask according to claim 2, wherein the plurality of slits have a width within a range of about 2 μm to about 3 μm.

4. The mask according to claim 2, wherein the plurality of slits are spaced within a range of about 4 μm to about 6 μm.

5. The mask according to claim 1, wherein each pattern portion has a first area and a second area, the first area including a plurality of first slits separated by first spaces, the second area including a plurality of second slits separated by second spaces, wherein the plurality of second slits are parallel to the plurality of first slits.

6. The mask according to claim 5, wherein the plurality of first slits correspond to the second spaces and the first spaces correspond to the plurality of second slits.

7. The mask according to claim 5, wherein the plurality of first slits and the plurality of second slits have a width within a range of about 2 μm to about 3 μm.

8. A method of crystallizing an amorphous silicon, wherein the method is used for manufacturing an array substrate having thin film transistors, pixel electrodes and an alignment key, the method comprising:
forming an amorphous silicon layer over a substrate;
forming an alignment key in the amorphous silicon layer;
preparing a mask including pattern portions and an alignment key pattern, the pattern portions corresponding to the thin film transistors;
disposing the mask over the substrate having the amorphous silicon layer, wherein the alignment key pattern is aligned with the alignment key; and
applying a first shot of a laser beam to in the amorphous silicon layer through the mask, thereby forming first polycrystalline silicon areas corresponding to the pattern portions of the mask.

9. The method according to claim 8, further comprising steps of moving the substrate including the first polycrystalline silicon areas and applying a second shot of a laser beam to in the amorphous silicon layer through the mask, thereby forming second polycrystalline silicon areas corresponding to the pattern portions of the mask.

10. The method according to claim 9, wherein the first shot and the second shot are non-overlapped.

11. The method according to claim 8, wherein the alignment key is formed around corner of the substrate.

12. The method according to claim 8, wherein the number of the alignment key is four.

13. A method of manufacturing an array substrate having thin film transistors, pixel electrodes and an alignment key, the method comprising:
forming an amorphous silicon layer on a substrate;
crystallizing the amorphous silicon layer to form polycrystalline silicon areas, including:
forming an alignment key in the amorphous silicon layer;
preparing a mask including pattern portions and an alignment key pattern, the pattern portions corresponding to the thin film transistors;
disposing the mask over the substrate having the amorphous silicon layer, wherein the alignment key pattern is aligned with the alignment key; and
applying a first shot of a laser beam to the amorphous silicon layer through the mask,
wherein the polycrystalline silicon areas correspond to the pattern portions of the mask;

forming active layers by patterning the polycrystalline silicon areas;

sequentially forming gate insulating layers and gate electrodes on the active layers;

doping impurities into both sides of the active layers by using the gate electrodes as masks, thereby forming source and drain regions;

forming an interlayer on the substrate including the gate electrodes, the interlayer having first and second contact holes exposing the source and drain regions, respectively;

forming source and drain electrodes on the interlayer, the source and drain electrodes connected to the source and drain regions through the first and second contact holes, respectively;

forming a passivation layer on the source and drain electrodes, the passivation layer having third contact holes exposing the drain electrodes; and forming pixel electrodes on the passivation layer, the pixel electrodes connected to the drain electrodes through the third contact holes.

14. The method according to claim 13, wherein crystallizing the amorphous silicon layer to form polycrystalline silicon areas includes moving the substrate having the amorphous silicon layer applied by the first shot of a laser beam and applying a second shot of a laser beam to in the amorphous silicon layer through the mask.

15. The method according to claim 14, wherein the first shot and the second shot are non-overlapped.

16. The method according to claim 13, wherein the number of the alignment key is four.

17. The method according to claim 13, wherein the alignment key is formed around corner of the substrate.

* * * * *